United States Patent
Chien

(10) Patent No.: US 7,081,405 B2
(45) Date of Patent: Jul. 25, 2006

(54) PACKAGE MODULE FOR AN IC DEVICE AND METHOD OF FORMING THE SAME

(75) Inventor: Ray Chien, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/948,199

(22) Filed: Sep. 24, 2004

(65) Prior Publication Data

US 2005/0040525 A1 Feb. 24, 2005

Related U.S. Application Data

(62) Division of application No. 10/326,063, filed on Dec. 23, 2003.

(30) Foreign Application Priority Data

Mar. 6, 2002 (TW) .............................. 91104190 A

(51) Int. Cl.
*H01L 21/44* (2006.01)
(52) U.S. Cl. ...................... 438/613; 438/650
(58) Field of Classification Search ........ 257/734–740, 257/706; 438/118, 613
See application file for complete search history.

(56) References Cited

U.S. PATENT DOCUMENTS

| | | | | |
|---|---|---|---|---|
| 5,311,061 A | * | 5/1994 | Sheck | 257/797 |
| 5,582,745 A | * | 12/1996 | Hans et al. | 216/18 |
| 5,834,323 A | * | 11/1998 | Ghafghaichi et al. | 438/17 |
| 6,266,249 B1 | | 7/2001 | Desai et al. | 361/760 |
| 6,879,039 B1 | * | 4/2005 | Khan et al. | 257/730 |
| 6,879,492 B1 | * | 4/2005 | Alcoe et al. | 361/748 |
| 2001/0000904 A1 | * | 5/2001 | Hashimoto et al. | 228/103 |
| 2002/0195716 A1 | * | 12/2002 | Magnuson et al. | 257/774 |
| 2003/0151143 A1 | * | 8/2003 | Tsai et al. | 257/774 |
| 2004/0155354 A1 | * | 8/2004 | Hanaoka et al. | 257/774 |
| 2005/0127501 A1 | * | 6/2005 | Khan et al. | 257/706 |

* cited by examiner

*Primary Examiner*—Hoai Pham
*Assistant Examiner*—Nathan W. Ha
(74) *Attorney, Agent, or Firm*—Troxell Law Office, PLLC

(57) ABSTRACT

A package module of an IC device comprises a substrate, at least one semiconductor device, and an interconnected layer. The substrate has a first surface and a second surface, wherein the substrate further contains a plurality of metal plugs, which penetrate the substrate and connect the first surface and the second surface. The semiconductor device is located on the first surface of the substrate, wherein the semiconductor device contains a plurality of metal pads, each of which is connected to one of the metal plugs. The interconnected layer is formed on the second surface of the substrate, wherein the interconnected layer is comprised of a plurality of metal circuits, a plurality of land pads, and a plurality of via pads, wherein each of the metal plugs is connected to one of the metal circuits.

8 Claims, 4 Drawing Sheets

PACKAGE MODULE FOR AN IC DEVICE AND METHOD OF FORMING THE SAME

This application is a Division of currently pending application U.S. Ser. No. 10/326,063, entitled "PACKAGE MODULE OF AN IC DEVICE AND METHOD OF FORMING SAME" and filed on Dec. 23, 2003.

BACKGROUND OF THE INVENTION

1. Field of the Invention

The present invention relates to a package module for an IC device and, more specifically, to a method of forming a package module for at least one IC device.

2. Discussion of the Background

A typical conventional flip-chip package is usually a bumped die attached onto a multi-layer substrate. Please refer first to FIG. 1, which schematically illustrates the cross-sectional diagram of the flip chip package module in accordance with the prior art. The flip chip package module generally consists of a substrate (1), a semiconductor (2), a plurality of bumps (3), an underfill layer (4), and a plurality of solder balls (5).

The substrate (1) is usually comprised of multiple-layers (4 or 6 layers) that are interconnected and the substrate comprises of a first surface (1a), a second surface (1b), a plurality of conductive vias (6), and a plurality of solder pads (7). The semiconductor device (2), having a plurality of die pads, is connected to the substrate (1) by means of wafer bumps, which can be solder bumps or other types of bumps. The die pads are first coated with layers of UBM (Under Bump Metallurgy, not shown in the figure) before applying the bumps (3). After the bumps (3) are formed on the semiconductor device (2), the semiconductor device (2) is attached onto the substrate (1) for electrical contact. The underfill layer (4), is filled into the gaps and cured between the substrate (1) and the semiconductor device (2), providing better mechanical strength. The solder balls (5) are located atop the solder pads (7) on the second surface (1b) of the substrate (1).

However, the prior art has the following disadvantages:

According to conventional packaging technology, layers of UBM (Under Bump Metallurgy) must be formed on the die pads before applying the wafer bumps. After forming the bumps, the semiconductor device is adhered to the first surface of the substrate. Moreover, bumps must be formed for electrical contacts with the substrate thereunder. The process of making UBM layers and bumps is costly.

2. The substrate in the prior art usually contains four or six layers, and at least two layers are required to avoid warpage and bending of the substrate. Therefore, the manufacturing process of the conventional substrate is very costly.

3. The probe card for the chip probe test of the bumped wafer is more expensive than a conventional probe card for bare wafers with bare probe pads on each die.

4. Most substrates are composed of organic material, and their CTE (Coefficient of Thermal Expansion) is around 18 ppm/° C., which is much higher than that of the die (CTE around 4 ppm/° C.). This mismatch of CTE values poses a threat to temperature-cycle reliability, particularly for large-area dies.

5. Due to the low viscosity requirement for the underfill liquid (before curing), the choice of underfill materials is limited. A consequence is that the moisture resistance of the cured underfill material is not as great as certain epoxy compounds or certain organic compounds serving as glues.

Based on the abovementioned drawbacks, it becomes an important issue to conceive a new package module of IC devices and a method of fabricating the same to minimize production costs and to increase manufacturing yields for semiconductor assembly technology.

SUMMARY OF THE INVENTION

One object of the present invention relates to a method of forming a package module for an IC device.

Another object of the present invention relates to a package module for at least one IC device.

An embodiment of the present invention discloses a package module for an IC device that comprises a substrate, a semiconductor device, and an interconnected layer. The substrate is composed of a first surface and a second surface, wherein the substrate further contains a plurality of metal plugs, which penetrate the substrate and connect the interconnected layer on the second surface and the semiconductor device on the first surface. The semiconductor device is located on the first surface of the substrate, wherein the semiconductor device contains a plurality of metal pads, each of which is connected to one of the metal plugs. The interconnected layer is formed on the second surface of the substrate, wherein the interconnected layer is comprised of a plurality of metal circuits, a plurality of land pads, and a plurality of via pads, wherein each of the metal plugs is connected to one of the metal circuits.

Another embodiment of the present invention discloses a package module for an IC device that comprises a substrate, a plurality of semiconductor devices, and an interconnected layer. The substrate is composed of a first surface and a second surface, wherein the substrate further contains a plurality of metal plugs, which penetrate the substrate and connect the interconnected layer on the second surface and the semiconductor device on the first surface. The plurality of semiconductor devices are located on the first surface of the substrate, wherein each semiconductor device contains a plurality of metal pads, each of which is connected to one of the metal plugs. The interconnected layer is formed on the second surface of the substrate, wherein the interconnected layer is comprised of a plurality of metal circuits, a plurality of land pads, and a plurality of via pads, wherein each of the metal plugs is connected to one of the metal circuits.

The present invention discloses a method of forming a package module for an IC device. A substrate is provided first, which is composed of a first surface and a second surface. After placing at least one semiconductor device with a plurality of metal pads on the first surface of the substrate, an alignment procedure and a laser drilling process are performed in sequence to form a plurality of via holes, each of which is aligned and in contact with one of the metal pads. Next, a metal layer is deposited on the second surface of the substrate, the via holes are also filled with deposited metal to form a plurality of metal plugs, each of which is connected to one of the metal pads of the semiconductor device.

After that, an interconnected layer is formed on the second surface of the substrate by a photo lithographic process and by an etching process, wherein the interconnected layer is composed of a plurality of metal circuits, a plurality of land pads, and a plurality of via pads (not shown).

DESCRIPTION OF THE PREFERRED EMBODIMENTS

Figure 1:
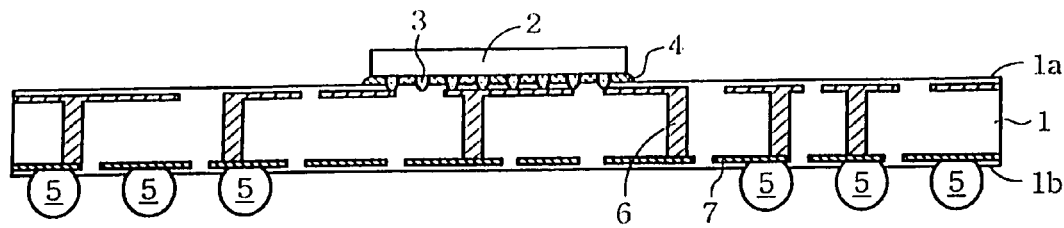
FIG. 1 schematically illustrates the cross-sectional diagram of the flip chip package module in accordance with the prior art.
Figure 2:
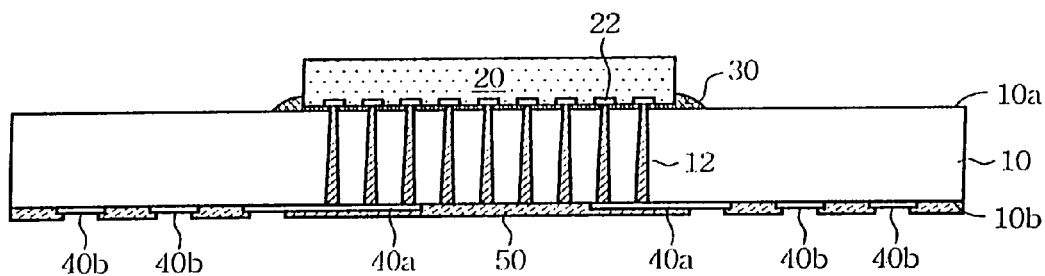
FIG. 2 schematically illustrates the cross-sectional diagram of the package module in accordance with the first embodiment of the present invention.

Please refer to FIG. 2, which schematically illustrates the cross-sectional diagram of the package module in accordance with the first embodiment of the present invention. The package module of an IC device comprises of a substrate (10), a semiconductor device (20), a glue layer (30), an interconnected layer (40) and an insulating layer (50).

The substrate (10) has a first surface (10a) and a second surface (10b). The substrate (10) is composed of a semi-transparent or opaque insulating material, whose CTE (Coefficient of Thermal Expansion) is close to that of the semiconductor device (20), which is around 4 ppm/° C. for a silicon die. A typical example material for the substrate can be a ceramic platelet.

The substrate (10) further contains a plurality of metal plugs (12), which penetrate the substrate (10) and make electrical connections from the first surface (10a) to the second surface (10b). The diameter of the metal plugs (12) is between 10 to 100 micro-meters.

The semiconductor device (20) is located on the first surface (10a) of the substrate (10). The semiconductor device (20) contains a plurality of metal pads (22), each of which is connected to one of the metal plugs (12).

The glue layer (30) is formed on the first surface (10a) of the substrate (10) to agglutinate the semiconductor device (20) to the substrate (10). The glue can be in a tape, liquid, or gel form, and can be composed of epoxy compounds, polyimide compounds, or other compounds with strong adhesion, stiffness, and low moisture absorption properties. Generally, a glue layer with a CTE lower than 15 ppm/° C. is preferred.

The interconnected layer (40) is formed on the second surface (10b) of the substrate (10). The interconnected layer (40) consists of a plurality of metal circuits (40a), a plurality of land pads (40b), and a plurality of via pads surrounding the metal vias (not shown in the figure). Each metal plug (12) is connected to a metal circuit (40a), and each metal plug (12) is connected to one of the metal pads (22) of the semiconductor device (20). Consequently, the electrical connection from the land pads (40b) to the metal pads (22) of the semiconductor device (20) is completed.

The protective, insulating layer (referred to as solder mask) (50) is formed on the second surface (10b) of the substrate (10) to cover and protect the metal circuits (40a) and via pads (not shown) thereunder.

Figure 3:
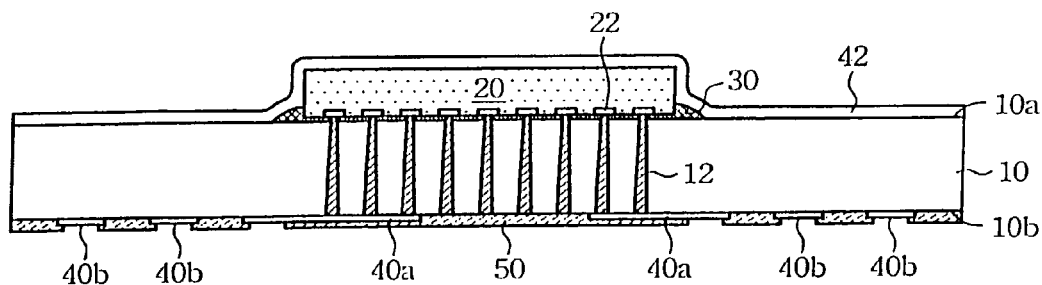
FIG. 3 schematically illustrates the cross-sectional diagram of the package module in accordance with the second embodiment of the present invention.

Please refer now to FIG. 3, which schematically illustrates the cross-sectional diagram of the package module in accordance with the second embodiment of the present invention. According to the second embodiment, the package module further comprises a metal layer (42) which is formed on top of the exposed first surface (10a) of the substrate (10), the back surface of the semiconductor device (20) and the exposed glue layer (30). The metal layer (42) covering the semiconductor device (20) and the exposed first surface (10a) of the substrate (10) can serve for some performance enhancing purposes, such as ESD protection, thermal dissipation enhancement, moisture resistance enhancement, etc. Other elements of the present embodiment are identical to those described in the first embodiment.

Figure 4:
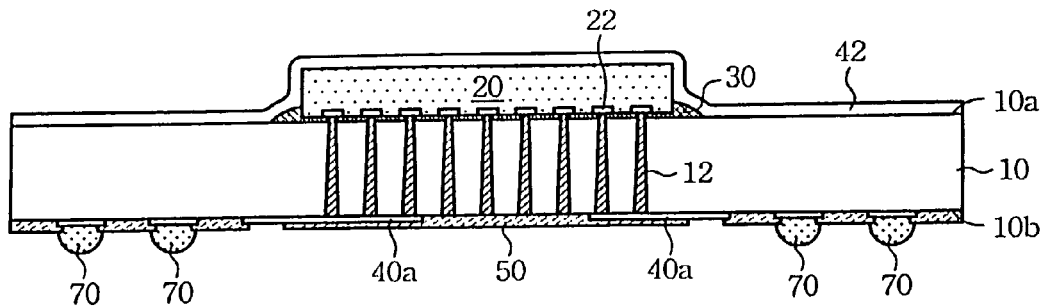
FIG. 4 schematically illustrates the cross-sectional diagram of the package module in accordance with the third embodiment of the present invention.

Please refer next to FIG. 4, which schematically illustrates the cross-sectional diagram of the package module in accordance with the third embodiment of the present invention. According to the third embodiment, the package module further comprises a plurality of solder balls (70), which are formed on the land pads (40b) on the second surface (10b) of the substrate (10). Other elements of the present embodiment are identical to those described in the second embodiment.

Figure 5:
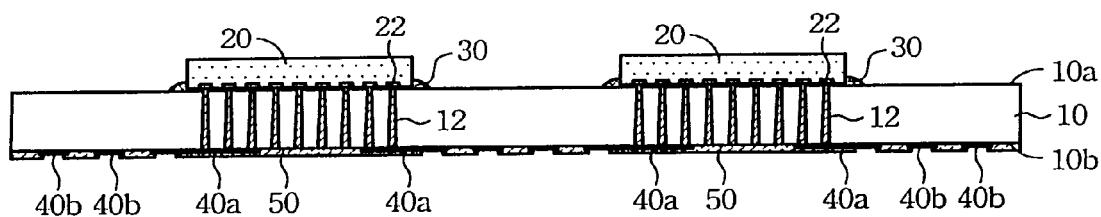
FIG. 5 schematically illustrates the cross-sectional diagram of the package module in accordance with the fourth embodiment of the present invention.

Please refer to FIG. 5, which schematically illustrates the cross-sectional diagram of the package module in accordance with the fourth embodiment of the present invention. The package module of an IC device is comprised of a substrate (10), a plurality of semiconductor devices (20), a glue layer (30), an interconnected layer (40) and a protective, insulating, layer (50).

The substrate (10) is composed of a first surface (10a) and a second surface (10b). The substrate (10) is composed of a semi-transparent or opaque insulating material, whose CTE (Coefficient of Thermal Expansion) is close to that of the semiconductor devices (20), which are around 4 ppm/° C., for silicon dies. A typical example material for the substrate can be a ceramic platelet. The substrate (10) further contains a plurality of metal plugs (12), which penetrate the substrate (10) and connect the interconnected layer (40) on the second surface (10b) and the semiconductor devices (20) on the first surface (10a). The semiconductor devices (20) are located on the first surface (10a) of the substrate (10) to form a multi-chip module (MCM) package. Each of the semiconductor devices (20) contains a plurality of metal pads (22), each of which is connected to one of the metal plugs (12). In addition, the glue layer (30), the interconnect layer (40) and the insulating layer (50) of the present embodiment are identical to those described in the first embodiment.

Referring now to FIG. 6, a schematic diagram of a method of forming a package module for an IC device according to the present invention is disclosed.

Figure 6A:
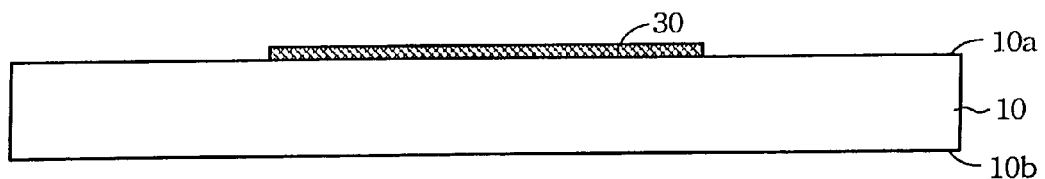
FIG. 6A to FIG. 6F are schematic diagrams of the method of forming a package module for an IC device according to the present invention.

As shown in FIG. 6A, a substrate (10) having a first surface (10a) and a second surface (10b) is provided. Next, a glue layer (30) is applied onto the first surface (10a) of the substrate (10) in the designated area(s) with conventional methods, and possibly followed by a pre-cure process. The designated area(s) match that of the die position(s) to be placed on the substrate (10).

FIG. 6A shows the schematic diagram of the first step of forming a package module for an IC device according to the first, second, and third embodiment of the present invention. Particularly, forming a glue layer (30) at several designated areas is needed for the MCM package, as described in the fourth embodiment. As the fabrication process of the fourth embodiment is identical to that described in the first, second, and third embodiment, FIG. 6A to FIG. 6F demonstrate only the schematic diagrams for the first, second, and third embodiment.

The substrate (10) is composed of semi-transparent or opaque insulating material, whose CTE (Coefficient of Thermal Expansion) is close to that of the semiconductor device (20), which is around 4 ppm/° C., for a silicon die. A typical example material for the substrate can be a ceramic platelet.

The glue can be in a tape, liquid, or gel form, and can be composed of epoxy compounds, polyimide compounds, or others with strong adhesion, stiffness, and low moisture absorption properties. Generally, a glue with CTE lower than 15 ppm/° C. is preferred.

Figure 6B:
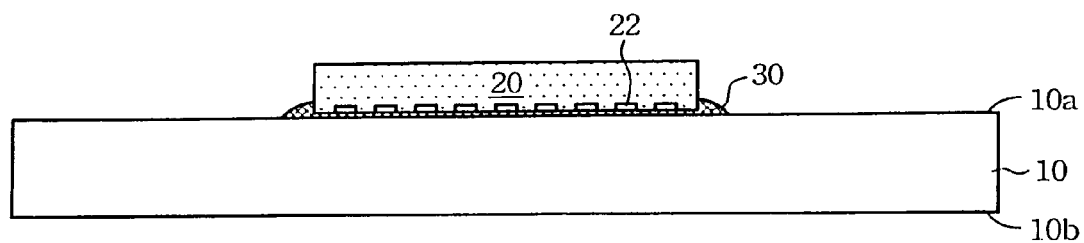

Referring next to FIG. 6B, the semiconductor device (20) with a plurality of metal pads (22) is first aligned and placed onto the designated area, which is atop the glue layer (30) on the first surface (10a) of the substrate (10). The metal pads (22) of the semiconductor device (20) face the first surface (10a) of the substrate (10). The semiconductor device (20) is then pressed firmly onto the glue layer (30), followed by a curing process.

Figure 6C:
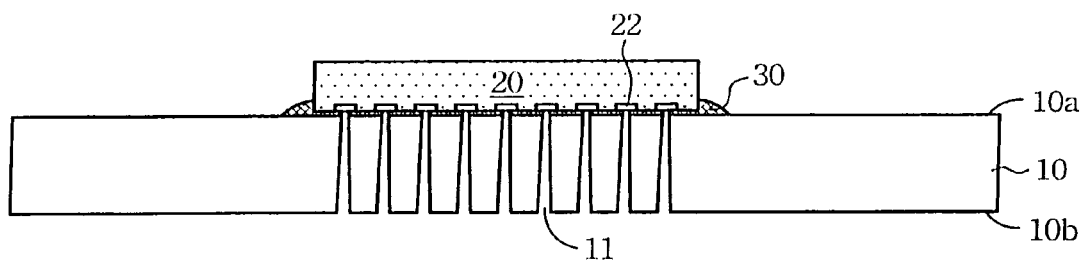

Next, please refer to FIG. 6C. Before the laser drilling process begins, an alignment procedure is performed to ensure that the laser beam can be properly aimed at the metal pads (22) of the semiconductor device (20). The alignment procedure can be performed by an optical camera (for semi-transparent substrate and glue) or by an X-ray camera from the second surface (10b) of the substrate (10). After that, a proper energy output of a laser beam is applied onto the second surface (10b) of the substrate (10) to evaporate and remove the substrate material on the optical path to form a plurality of via holes (11), each of which is aligned with a metal pad (22). During the laser drill process, the glue layer (30) and a thin surface layer of the metal pads (22) on the laser optical path are also evaporated and removed, therefor ensuring a clean electrical contact to the metal pad (22). The diameter of the via holes (11) is in a range between 10 to 100 micro-meters.

The laser can be an excimer layer or a YAG laser with a pulsed beam output. For each via hole (11) formation, several laser shots may be needed in order to reduce micro-cracking of the substrate (10) and retain a good via hole profile by a lesser thermal shock during each laser irradiation shot.

Figure 6D:
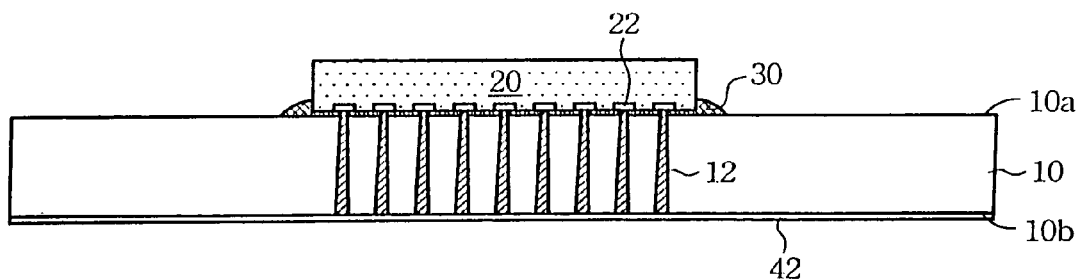

Referring now to FIG. 6D, a cleaning process is first performed to reduce or eliminate debris (organic or inorganic from the glue layer (30), a thin surface layer of the metal pads (22) and the substrate (10)) and reduce or eliminate contamination on the second surface (10b) of the substrate (10) and the inner surfaces of the via holes (11). According to the present invention, the cleaning process can be a plasma cleaning process, a chemical vapor cleaning process, or a chemical liquid cleaning process.

Thereafter, a metal layer (42) is formed on the second surface (10b) of the substrate (10) by physical vapor deposition (PVD), chemical vapor deposition (CVD), plating, or the combination thereof. During metal layer (42) formation, the via holes (11) are filled up with metal and therefore a plurality of metal plugs (12) are formed, each of which is connected to one metal pad (22) of the semiconductor device (20). The metal layer (42) can be composed of a layer of TiN, TiW, Cu, Ti, W, TaN or other metals, or a composite layer of a combination of metals thereabove.

Whereas in the second embodiment of the present invention, the metal layers (42) are also formed on the exposed areas of the first surface (10a) and the semiconductor device (20), in order to cover the semiconductor device (20) with a metal coating. The metal layer (42) covering the semiconductor device (20) can serve some performance enhancing purposes, such as ESD protection, thermal dissipation enhancement, moisture resistance enhancement, etc.

Figure 6E:
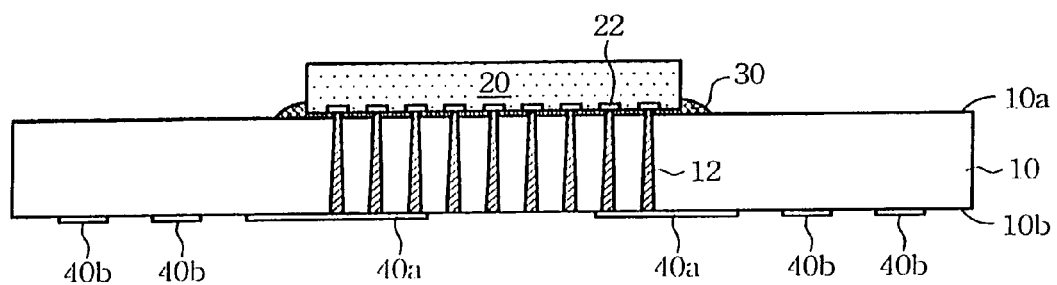

Referring then to FIG. 6E, an interconnected layer (40) is formed on the second surface (10b) of the substrate (10) by performing a photolithography process and an etching process. The interconnected layer (40) consists of a plurality of metal circuits (40a), a plurality of land pads (40b), and a plurality of via pads (surrounding the metal via (12), not shown in the figure). Each metal plug (12) is connected to a metal circuit (40a), and each metal plug (12) is connected to one metal pad (22) of the semiconductor device (20). Consequently, the electrical connection to the land pads (40b) and the metal pads (22) of the semiconductor device (20) is completed.

The etching process can be a plasma etching process or a chemical wet etching process. Thereafter, a photo resistant stripping process and a cleaning process are performed in sequence.

Figure 6F:
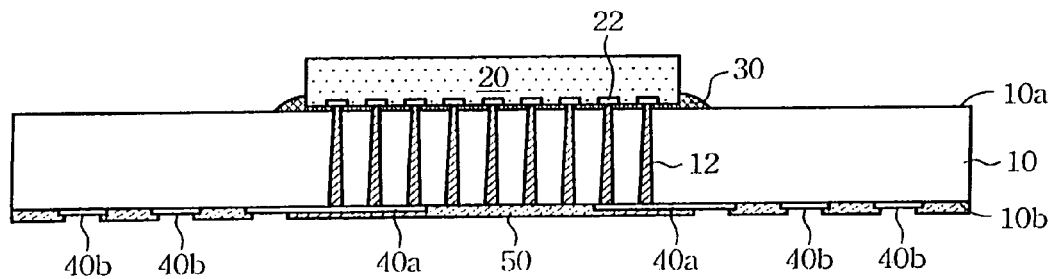

Referring next to FIG. 6F, a layer of photo-imaginable insulating material is first coated onto the second surface (10b) of the substrate (10). The coating method can be by spray coating, printing, or other means. The coated insulating material also covers and fills the inner surface of the metal plugs (12).

Thereafter, an insulating layer (or solder mask) (50) is formed to protect the metal circuits (40a) by performing a photo lithographic process followed by an etching process. Because the insulating material is photo-imaginable, no further photo resisting is needed for the photo lithographic process. After etching a curing process can be performed to harden the insulating layer (50).

Furthermore, layers of Ni/Au (not shown in the figure) or a layer of organic anti-oxidation film can also be applied onto the land pads (40b) for surface protection purposes or for soldering purposes. According to the third embodiment of the present invention, a solder ball (70) can be formed on each land pad (40b) plated with Ni/Au layers.

The above-mentioned method of forming package module for an IC device in the present invention has the following advantages:

The use of costly UBM (Under Bump Metallurgy) and wafer bumping processes are eliminated in the present invention.

The use of a costly multi-layer flip-chip substrate is eliminated in the present invention.

The use of costly vertical probe cards for bumped dies is eliminated.

The temperature-cycle reliability of the flip-chip package improves when the CTE of the interposer is chosen to be close to that of the die (around 4 ppm/° C. for silicon).

According to the second embodiment of the present invention, the optional metal layer(s) on the top side (die side) can serve some performance purposes, such as ESD protection, thermal dissipation enhancement, moisture resistance enhancement, etc.

The moisture resistance of the cured glue under/surrounding the die, which could be of higher viscosity glue compound compared to that found in a conventional underfill material, can be improved.

The low-CTE interposer material (ceramic as an exemplar material) has a much higher dimensional stability compared to conventional organic substrate materials. This dimensional stability makes high density interconnected (HDI) metal lines and fine pitch possible.

The LGA (land grid array) package form disclosed herein could be easily converted to PGA (pin grid array), CGA (column grid array) or BGA (ball grid array) package forms by further processes.

The conventional build-up process(es) can be applied to the present invention to form build-up layer(s) on the second surface (10b) of the substrate; in order to make a package module with multi-layer interconnections.

The many features and advantages of the invention disclosed herein are apparent from the detailed specification, and thus, it is intended by the appended claims to cover all such features and advantages of the invention which fall within the true spirit and scope of the invention. Furthermore, since numerous modifications and variations will be apparent to those skilled in the art, it is not our intention to limit the invention to the exact embodiment, configuration or operation illustrated or described herein. Accordingly, all suitable modifications and equivalents may be resorted to falling within the scope of the invention.

What is claimed is:

1. A method of forming a package module of at least one IC device comprising:
   providing a surface, having a first surface and a second surface;
   placing and affixing at least one semiconductor device with a plurality of metal pads on said first surface of said substrate;
   performing a laser alignment procedure, and then performing a laser drilling process from said second surface of said substrate to form a plurality of via holes, each of which is aligned to and touches one of said metal pads;
   performing a cleaning process to clean the said second surface of said substrate and the inner surfaces of the said via holes;
   forming a metal layer on said second surface of said substrate, and also filling into said via holes to form a plurality of metal plugs, each of which is connected to one metal pad of said semiconductor device;
   forming an interconnected layer on said second surface of said substrate by performing a photo lithographic process and an etching process on the metal layer; wherein said interconnected layer is composed of a plurality of metal circuits, a plurality of land pads, and a plurality of via pads.

2. The method of claim 1, further comprising a process for forming an insulating layer on said second surface of said substrate to cover and protect said metal circuits.

3. The method of claim 2, further comprising a process for forming a solder ball on each of said land pads.

4. The method of claim 1, further comprising a process for forming a metal layer on the exposed area of said first surface of said substrate and to cover said semiconductor device.

5. The method of claim 1, wherein said laser alignment procedure can be preformed by an optical camera from said second surface of said substrate, whenever said substrate is composed of translucent material.

6. The method of claim 1, wherein said laser alignment procedure can be preformed by an X-ray camera from said second surface of said substrate, whenever said substrate is composed of an optically non-transparent material.

7. The method of claim 1, wherein the step of placing and affixing at least one semiconductor device with a plurality of metal pads on said first surface of said substrate is performed utilizing a glue layer disposed there between.

8. The method of claim 1, wherein the step of forming a metal layer on said second surface of said substrate, and also filling into said via holes to form a plurality of metal plugs is performed utilizing a process selected from a group consisting of physical vapor deposition (PVD), chemical vapor deposition (CVD), plating, and a combination thereof.

* * * * *